(12) United States Patent
Parker, Jr. et al.

(10) Patent No.: US 6,303,881 B1
(45) Date of Patent: Oct. 16, 2001

(54) VIA CONNECTOR AND METHOD OF MAKING SAME

(75) Inventors: John LeRoy Parker, Jr., Mechanicsville; Pamela L. Miscikowski, Richmond, both of VA (US)

(73) Assignee: Viasystems, Inc., Richmond, VA (US)

( * ) Notice: Subject to any disclaimer, the term of this patent is extended or adjusted under 35 U.S.C. 154(b) by 0 days.

(21) Appl. No.: 09/649,169

(22) Filed: Aug. 25, 2000

Related U.S. Application Data

(62) Division of application No. 09/045,615, filed on Mar. 20, 1998.

(51) Int. Cl.[7] .............................. H01R 12/04; H05K 1/11
(52) U.S. Cl. ..................... 174/264; 174/256; 174/257; 174/261; 174/262; 361/748; 361/767
(58) Field of Search ................... 174/264, 262, 174/250, 261, 255, 257, 256, 258, 265; 361/748, 767, 762, 771; 29/825, 846, 852, 829

(56) References Cited

U.S. PATENT DOCUMENTS

| | | | |
|---|---|---|---|
| 3,471,631 | * 10/1969 | Quintana | 174/264 |
| 3,601,523 | 8/1971 | Arndt | 174/68.5 |
| 4,131,516 | 12/1978 | Bakos et al. | 204/15 |
| 4,323,593 | 4/1982 | Tsunashima | 29/852 |
| 4,325,780 | 4/1982 | Schulz, Sr. | 29/852 |
| 4,383,363 | 5/1983 | Hayakawa et al. | 29/847 |
| 4,435,611 | * 3/1984 | Ohsawa et al. | 174/257 |
| 4,911,796 | 3/1990 | Reed | 204/15 |
| 5,243,142 | * 9/1993 | Ishikawa et al. | 174/262 |
| 5,277,787 | * 1/1994 | Otani et al. | 205/125 |
| 5,293,504 | 3/1994 | Knickerbocker et al. | 174/262 |
| 5,319,159 | 6/1994 | Watanabe et al. | 174/162 |
| 5,340,947 | * 8/1994 | Credle et al. | 174/262 |
| 5,421,083 | * 6/1995 | Suppelsa et al. | 29/852 |
| 5,435,480 | * 7/1995 | Hart et al. | 228/180.1 |
| 5,473,120 | 12/1995 | Ito et al. | 174/264 |
| 5,481,795 | * 1/1996 | Hatakeyama et al. | 29/852 |
| 5,510,580 | * 4/1996 | Shirai et al. | 174/266 |
| 5,527,998 | 6/1996 | Anderson et al. | 174/255 |
| 5,557,844 | 9/1996 | Bhatt et al. | 29/852 |
| 5,571,593 | 11/1996 | Arldt et al. | 428/131 |
| 5,585,673 | 12/1996 | Joshi et al. | 257/751 |
| 5,662,987 | * 9/1997 | Mizumoto et al. | 428/209 |
| 5,674,787 | 10/1997 | Zhao et al. | 437/230 |
| 5,761,803 | 6/1998 | St. John et al. | 29/852 |
| 5,879,787 | * 3/1999 | Petefish | 428/209 |
| 5,958,562 | * 9/1999 | Tsuji et al. | 341/143 |
| 5,960,538 | 10/1999 | Kawakita et al. | 29/852 |
| 5,977,490 | * 11/1999 | Kawakita et al. | 174/265 |

* cited by examiner

Primary Examiner—Jeffrey Gaffin
Assistant Examiner—Ishwar B Patel
(74) Attorney, Agent, or Firm—Senniger, Powers, Leavitt & Roedel

(57) ABSTRACT

An insulator substrate or printed circuit board (PCB) having a filled and plated via is provided. The plated via is filled with an electrically conductive fill composition. A conductive cap layer is formed on both ends of the conductive fill composition in the via and the major surfaces of the insulator substrate and can be bonded to a surface mount contact as a land or a pad.

18 Claims, 2 Drawing Sheets

VIA CONNECTOR AND METHOD OF MAKING SAME

CROSS-REFERENCE TO RELATED APPLICATION

This is a divisional of application Ser. No. 09/045,615 filed Mar. 20, 1998, the entire disclosure of which is incorporated herein by reference.

FIELD OF THE INVENTION

The present invention relates in general to printed circuit boards and to methods for fabricating printed circuit boards. More particularly, the present invention relates to printed circuit boards with improved vias which provide electrical communication between wiring patterns formed on two opposing surfaces of a circuit board and/or within the internal strata of the circuit board, and to methods for making improved circuit boards having such vias.

BACKGROUND OF THE INVENTION

Increasing levels of integration of integrated circuit (IC) chips reduces the chip count of a functional circuit, while significantly increasing the input/output (I/O) count of the individual integrated circuits making up the functional circuit. This drive for increased circuit and component density in the individual IC chips leads to a parallel drive for increased circuit and component density in the printed circuit boards carrying the chips and in the assemblies using them.

Typically, a conventional printed wiring board carries ICs as well as other discrete electronic components and circuit elements, which are interconnected to provide the particular electronic circuit functions. In the prior art, those ICs, discrete electronic components, and circuit elements are usually bonded to the printed wiring board using vias or through holes formed in the printed wiring board through which lead wires may be inserted and soldered to the board. However, there have been advances in surface mounting technology widely employed in the printed wiring board manufacturing field. This technology permits an IC to be mounted together with its associated elements on the printed wiring board without forming any through holes or vias in the board. Thus, ICs and other on-chip elements may be mounted on a surface mount land or chip land directly without using the through holes or vias.

To provide for the interconnections between the on-chip elements on the surface mount land on one side and a circuit on the opposite side of, or within, the printed wiring board, the appropriate vias are often provided remotely from the surface mount land, and any wiring pattern required for interconnecting the elements by way of the vias must be formed on the surface of the base plate.

Thus, according to the prior art, the surface mount land or chip land and the vias or through holes are provided at different locations on the printed wiring board. As the size of each of the ICs and other elements is reduced, a corresponding reduction in the size of the surface mount land is required so that required board space is minimized. The wiring pattern that includes leads drawn out from the surface mount land and distributed across different locations must be accordingly fine, but technically, this is practically difficult to achieve. It is also difficult to secure the space required for wiring the leads. In particular, for double-sided high-density wiring pattern implementation, this space limitation poses a problem.

The vias formed in the printed wiring board are exposed on each of the opposite sides of the board. When leads are inserted through the corresponding vias, and the associated circuit components are fixed by the board in solder, surplus solder may flow through the vias, thereby reaching the components on the surface mount land.

In other conventional circuit boards which carry wiring patterns formed on two opposing major surfaces, vias or through holes are formed at desired positions after conductive layers are formed on the entire surface of the opposing major surfaces of the circuit board. Inner surfaces of the thus formed vias are coated with plated layers through the use of a chemical plating method or a chemical/electrical plating method, thereby providing electrical communication between the conductive layers formed on the two major surfaces or internal to the circuit board by way of the plated layers.

The vias are formed through the use of a drilling method or a punching method. Therefore, there is the possibility that the circuit board or the conductive layers become distorted during the formation of the through holes. The thus formed distortion will adversely influence the formation of the plated layers so that an effective electrical connection cannot be achieved between the two conductive layers. In addition, fine wiring patterns cannot be formed near the vias due to the distortion of the conductive layers. Thereafter, the conductive layers are shaped in a desired configuration to obtain wiring patterns formed on both of the major surfaces of the circuit board.

Another example of prior art via connectors is disclosed in U.S. Pat. No. 3,601,523 "THROUGH HOLE CONNECTORS" to Arndt, issued on Aug. 24, 1971, wherein a conductive adhesive is disposed in the through holes or vias for providing electrical communication between the conductive layers formed on both of the major surfaces of the circuit board. In the device of the '523 patent, the vias are formed after the conductive layers are formed on both of the major surfaces of the circuit board and, therefore, there is a possibility that the conductive layers will become distorted near the vias. Moreover, in the '523 patent, electrical communication between the conductive layer and the conductive adhesive is achieved only through the use of the thickness of the conductive layer. In addition, the conductive adhesive is exposed to the ambience. Therefore, the shaping of the wiring patterns must be conducted through the use of a dry film or a resist sheet.

The increased circuit and component density in the printed circuit boards makes the ability to locate either solder surface mount components or place additional circuitry layers directly above conductive vias highly desirable. This is especially the case when the density of the vias required to service the I/O's of the surface mount components is such that there is no surface area available for attachment pads interstitial to the through hole grid.

The problem is especially severe with fine pitch ball grid array components and flip chip attach integrated circuits. Soldering of these surface mount components to the surface pads, i.e., lands, of conventional vias is highly undesirable. This is because the solder used for assembly tends to wick down into the vias. The result is low volume, unreliable solder joints.

One solution that has been proposed is filling the vias. However, known methods of filling vias of printed circuit boards have deficiencies. For example, they suffer from bleed of the resin component of the fill material along the surface of the boards. This resin also bleeds into the holes which are not to be filled. This leads to short circuits and to soldering defects during assembly.

Thus, conductive vias provide an immediate connection from a surface mounted device to the core of a printed circuit board, thereby avoiding inefficient fan out routing patterns that consume space on the outer layers of the multilayer board. These designs, however, present significant assembly problems. Small vias act as entrapment sites for materials that can eventually re-deposit onto the host surface mount land and cause both assembly and reliability problems. Also, these vias act as unintended reservoirs for solder paste that is stenciled onto the surface mount land and used to attached an electronic device to the board. Consequently, an allowance must be made of the solder paste that will be captured by the via and will not be available for the solder joint formed between the device and the board. Typically, the same allowance is made for each via by slightly enlarging the solder paste stencil aperture for each surface mount pad containing a via by some common amount. Because the precise allowance needed varies from via to via, this method leads to an insufficient amount of paste for some lands causing poor solder joints and an over-abundance of solder on others causing solder shorts; both of which unfavorably impact assembly yields.

Another example of prior art via connectors is disclosed in U.S. Pat. No. 5,557,844 "METHOD OF PREPARING A PRINTED CIRCUIT BOARD" to Bhatt et al., issued on Sep. 24, 1996 and assigned to IBM, (referred to herein as "IBM"), wherein a printed circuit board has two types of plated through holes, filled and unfilled. The two types of through holes are formed at different times during the manufacturing process. The through holes that are to be filled are formed first, and the through holes that remain unfilled are later formed using the location of the first through holes for registration. Because all the holes are not formed simultaneously, misregistration of subsequently applied wiring patterns with the holes is likely as a result of tolerance build-ups. Moreover, IBM uses an electroless deposition for the plating of the sidewalls of the through holes, thus limiting the layer thickness to approximately 0.2 mils.

Although the art of vias and through hole connectors on printed circuit boards is well developed, there remain some problems inherent in this technology, particularly the vias and through hole connectors acting as solder reservoirs, thus leading to soldering defects, and the electrical conductivity of the vias. Therefore, a need exists for a via or through hole connector that overcomes the drawbacks of the prior art.

SUMMARY OF THE INVENTION

The present invention is directed to a method of preparing a printed circuit board (PCB) comprising the steps of forming a hole in the PCB to form a via having sidewalls, depositing a first conductive material on the sidewalls of the via, filling the via with a second conductive material, and depositing a third conductive material on first conductive material on the PCB and on the exposed portions of the second conductive material in the via.

According to one aspect of the present invention, the via is formed by drilling, punching, laser drilling, or photo-definition, and is preferably formed at the same time as all other holes or openings in the board are formed. Simultaneous formation of all openings in the board lessens misregistration of subsequently applied wiring patterns with the openings as a result of tolerance build-ups.

In accordance with other aspects of the present invention, the first and third conductive materials are copper and the first conductive material is preferably deposited to a substantially uniform thickness exceeding approximately 0.2 mils and the third conductive material is preferably deposited to a substantially uniform thickness of between about 0.4 mils and about 0.8 mils, and more preferably each conductive material is deposited to a thickness of about 0.5 mils.

In accordance with a further aspect of the present invention, the first conductive material is deposited by electrolytic plating and the third conductive material is deposited by feature plating or panel plating.

In accordance with another aspect of the invention, a mask is applied to the surface of the circuit board as a part of the step of filling the vias with the second conductive material. The mask allows only selected vias to be filled with the second conductive material, and protects the first conductive material from being damaged by the via-filling mechanism, such as a doctor or squeegee blade.

In a further embodiment within the scope of the present invention, a method of preparing a PCB comprises the steps of forming a hole in the PCB to form a via extending at least partially through the PCB to an internal surface of the PCB, with the via having sidewalls extending therethrough, depositing a first conductive material on at least one side of the PCB and on the sidewalls of the via such that the via has an opening, filling the opening with a second conductive material, and depositing a third conductive material on the first conductive material on the at least one side of the PCB and on an end of the second conductive material in the opening.

In a further embodiment within the scope of the present invention, a method of making a via connector in an insulator circuit board substrate adapted to carry wiring patterns on both major surfaces, or on one major surface and one of the internal strata thereof is provided. The method comprises the steps of providing an insulator substrate, forming a via having sidewalls in the insulator substrate between the surfaces by penetrating the insulator substrate through the use of a penetrating means, depositing a first conductive layer on at least one of the major surfaces and on the sidewalls of the via in such a manner as to substantially completely cover the major surface of the insulator substrate and the sidewalls while leaving an opening, depositing a conductive material in the opening of the via to form a via connector, and forming a second conductive layer on the major surface of the insulator substrate subsequent to the formation of the via and the deposition of the conductive material therein in such a manner as to form a substantially flat surface extending across substantially the entirety of the major surface of the substrate and across the via so that an end portion of the via connector is covered by and makes direct contact with the second conductive layer.

According to further aspects of the invention, the second conductive layer is etched to form wiring patterns on the major surface of the insulator substrate which is electrically connected to the other major surface or one of the internal strata through the via connector. Moreover, the conductive material is deposited so as to completely fill the via-through-hole.

Another embodiment within the scope of this invention includes a double-sided printed wiring board comprising an insulator substrate having a via having sidewalls extending therethrough, a first electrically conductive layer electrolytically disposed over both surfaces of the insulator substrate and through the via along the sidewalls between the opposite sides of the insulator substrate, and the first electrically conductive layer leaving a via-through-hole within the via and which via-through-hole extends between opposite sides of the insulator substrate, a mass of conductive material filling the via-through-hole and having opposite ends located at each of the opposite sides of the insulator substrate, respectively, and a second electrically conductive layer covering the first electrically conductive layer disposed over both surfaces of the insulator substrate and covering both ends of the mass of conductive material on both sides of the insulator substrate.

The foregoing and other aspects of the present invention will become apparent from the following detailed description of the invention when considered in conjunction with the accompanying drawing.

DESCRIPTION OF EXEMPLARY EMBODIMENTS AND BEST MODE

According to the present invention, an insulator substrate or printed circuit board (PCB) having a filled and plated via is provided. The plated via is filled with an electrically conductive fill composition. A conductive cap layer is formed atop the ends of the filled via and can be bonded to a surface mount contact as a land or a pad.

FIGS. 1A through 1E show fabrication steps of one embodiment of the via connector in accordance with the present invention.

Figure 1A:
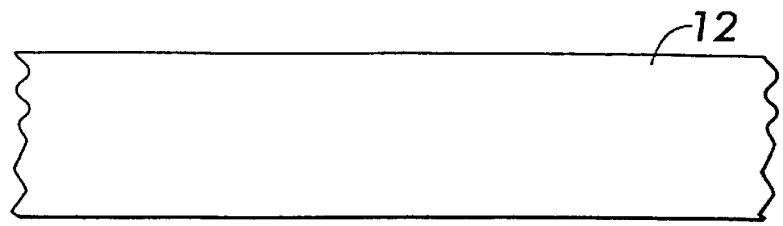
FIGS. 1A through 1E are sectional views of the fabrication steps of an exemplary via connector in accordance with the present invention.
Figure 1B:
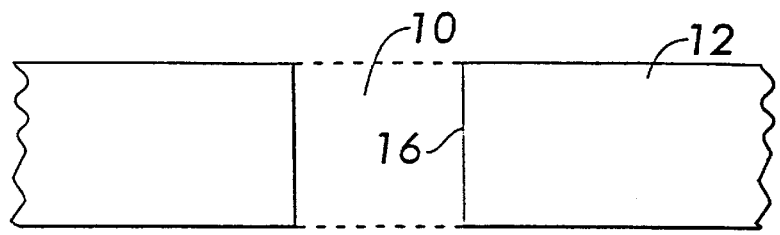

FIG. 1A shows an insulator substrate 12, such as a printed circuit board or a flexible thin-film substrate. A through hole or via 10 is formed in the insulator substrate 12 at a desired position, as shown in FIG. 1B. Preferably, the via 10 is formed through the use of a drilling method, but any conventional method, such as punching, laser drilling, or photo-definition, can be used. The via 10 can be any diameter, but is preferably in the range between about 2 mils and about 25 mils. Preferably, all or substantially all of the openings or holes in the printed circuit board are formed at the same time, whether they are ultimately to be filled, as described below, or not. This avoids misregistration, especially from tolerance build-ups, that can occur between the filled and unfilled vias between the separate hole forming processes and the subsequently formed wiring patterns that are formed by the use of one or more masks that must be registered with the holes. This factor is especially important as PCBs' wiring patterns become finer and more dense.

Figure 1C:
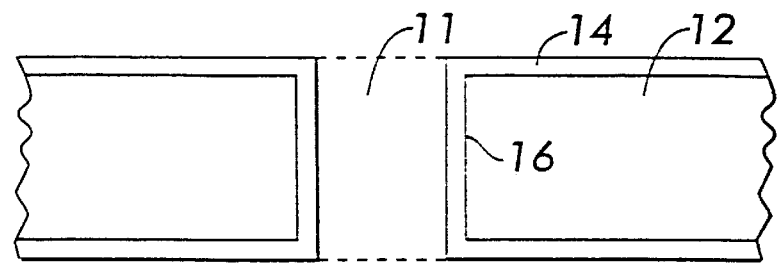

Thereafter, as shown in FIG. 1C, a first conductive layer 14 of a first conductive material is deposited on the surfaces of the substrate 12 and on the sidewalls 16 of the via 10 to leave a via-through-hole 11 in the via 10. Preferably, the first conductive material is copper. The first conductive material is preferably deposited to a thickness in the range between about 0.1 and about 0.8 mils, and more preferably deposited to a thickness of greater than approximately 0.2 mils, and most preferably to a thickness of approximately 0.5 mils. The layer 14 on the sidewalls is preferably thick enough to provide a robust mechanical structure that will survive the thermal fluctuations and aggressive handling experienced by a PCB during subsequent component assembly and usage.

Preferably, an electrolytic plating process is used to deposit the layer 14. The electrolytic process follows a surface preparation step involving either a direct metallization process or an electroless process. The surface preparation step includes depositing a thin conductive layer that sensitizes the surface and assists in the adhesion of the layer 14 to the sidewalls 16. It should be noted that IBM does not use an electrolytic plating process and thus is limited to a conductive layer thickness typical of electroless depositions, which is limited to approximately 0.2 mils. IBM does not use electrolytic plating because a surface preparation step involving depositing a thin conductive layer will either cover the entire pattern, thereby rendering the device inoperable, or involve additional processing steps leading to increased complexity and higher cost.

Direct metallization comprises depositing a thin conductive molecular layer (not shown) on the substrate surfaces and the via sidewalls prior to depositing the layer 14. The conductive layer is preferably palladium or platinum. This process avoids the-typical catalytically deposited copper, thereby rendering this device more economically feasible.

The electroless surface preparation process comprises depositing a thin conductive layer (not shown), preferably copper, on the substrate surfaces and the via sidewalls prior to depositing the layer 14, to a thickness in the range between about 30 micro-inches and about 200 micro-inches, and more preferably to a thickness in the range between about 70 micro-inches and about 80 micro-inches.

The surface preparation followed by electrolytic deposition results in a highly linear distribution of the layer 14 on the sidewalls 16 of the via 10.

Figure 1D:
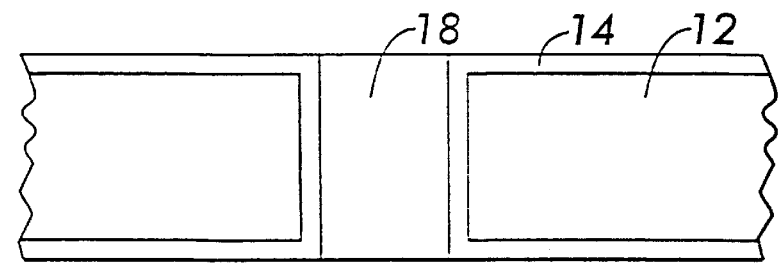

After the sidewalls 16 of the via 10 have been plated with the layer 14, a second conductive material 18, such as a conductive ink, paste, or adhesive, is introduced into the via-through-hole 11 as shown in FIG. 1D. Preferably, the second conductive material 18 is a conductive ink, preferably containing silver, copper, or a noble metal suspended in an epoxy resin, such as CB100, manufactured by E. I. du Pont de Nemours and Company of Wilmington, Del. However, any flowable, curable composition with conductive properties can be used as the second conductive material. The second conductive material 18 is patterned for deposition in the via-through-hole 11 using a stencil or a mask. After the second conductive material 18 is deposited in the via-through-hole 11, the second conductive material 18 is partially or tack cured, and any excess material 18 (usually in the form of a small peak or cap extending above layer 14) is removed by, for example, light mechanical abrasion. Preferably, no conductive material 18, such as ink particles, remains on the layer 14 after the removal process. The second conductive material 18 is then hard cured. The second conductive material 18 is preferably sufficiently conductive to allow subsequent plating of a conductive cap layer over the filled and plated via 10.

Figure 1E:
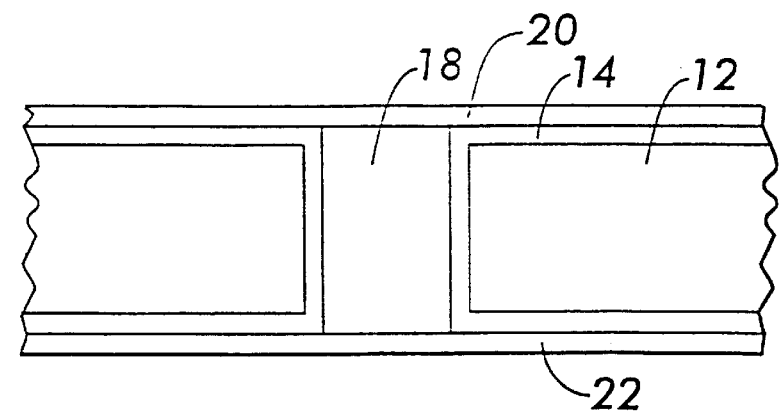

After the second conductive material 18 is cured, layers 20 and 22 of a third conductive material, preferably copper, are formed on both major surfaces, respectively, of the insulator substrate 12 inclusive of both ends of the second conductive material 18, as shown in FIG. 1E. That is, the upper conductive layer 20 and the lower conductive layer 22 extend across the via 10 and are in electrical communication with each other through the second conductive material 18 and the first conductive layer 14. Thus, the via 10 is sealed by the conductive layers 20 and 22, with the conductive layers 20 and 22 acting as a conductive cap.

The conductive layers 20 and 22 can be formed by any conventional process such as attaching a copper film to the substrate or plating a copper layer on the substrate.

Preferably, feature plating or panel plating is used to deposit copper to a thickness in the range between about 0.4 mils and about 0.8 mils, and more preferably to a thickness of approximately 0.5 mils.

Thereafter, the conductive layers 20 and 22 are shaped in a desired configuration to obtain desired wiring patterns, through the use of conventional photolithography and print and etch methods, for additive circuitization and solderability.

Because the sidewalls 16 are plated with the first conductive layer 14 prior to introducing the second conductive material 18, the reliability of the electrical connection between the upper conductive layer 20 and the lower conductive layer 22 is increased. Moreover, the layer 14 improves the structural integrity of the connection between the conductive layers 20 and 22 and provides a more robust structure.

In accordance with the present invention, a plurality of vias 10 can be formed concurrently in the insulator substrate 12 at desired positions. During subsequent processing, the vias 10 are filled with the conductive material 18 at the same time, preferably using a stencil. This provides improved registration of the vias and circuit patterns formed on the substrate.

The present invention allows for the conservation and recapture of the conductive fill material 18. Because a stencil is used to fill the via(s), material usage of the conductive fill material is decreased because the stencil captures excess conductive material 18 which can be recovered without contamination, unlike prior methods in which the excess conductive fill material resides on a copper layer which contaminates the conductive fill material, thus rendering it unsuitable for recovery and reuse. These factors are important to manufacturing costs because curable conductive materials tend to be very expensive. Moreover, because a stencil is used to fill the via(s) 10, the present invention provides the advantage of being able to use a higher force on the squeegee blade to fill the via(s) 10 with the conductive fill material 18, an advantage believed to be especially useful to ensure complete filling of blind vias. A higher force can cause the copper surface to scratch. A stencil protects against this damage.

Figure 2:
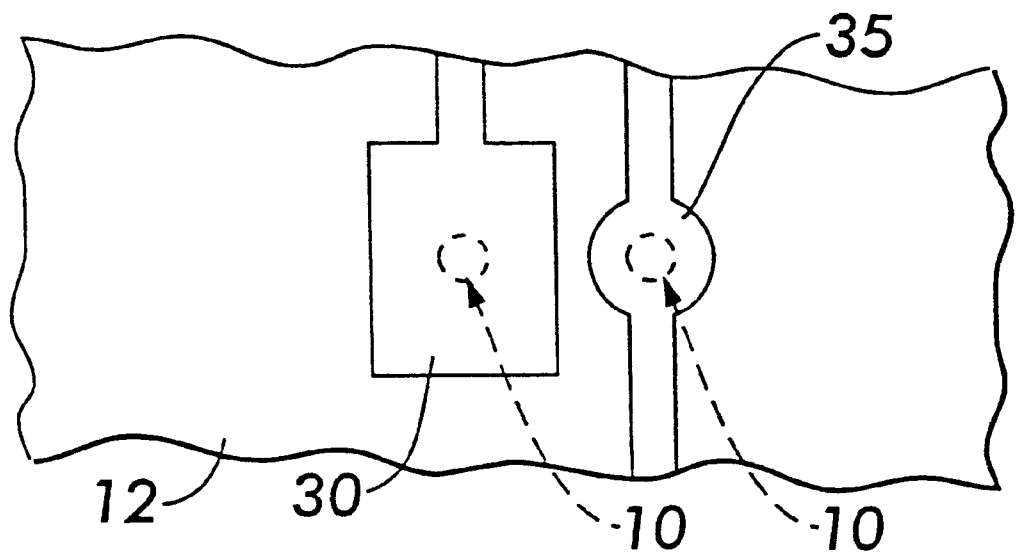
FIG. 2 is a schematic representation showing a surface mount land in plan.

FIG. 2 depicts an exemplary surface mount land 30 aligned with a filled and plated via 10 as well as a pattern 35 aligned with a filled and plated via 10.

The double sided printed wiring board described above allows the surface mount land 30 and a pattern on the opposite side to be electrically conductively interconnected by way of the filled and plated via 10. This eliminates the need of providing a via remotely from the surface mount land 30, and therefore it is not necessary to implement a wiring pattern to interconnect the surface mount land 30 to a remote via. Thus, a high density packing can be realized.

Although the above exemplary embodiments have described vias and methods of making vias between two opposing surfaces of a circuit board or insulator substrate, it is nevertheless intended that the exemplary vias and methods of making vias can also be used to provide electrical communication between wiring patterns formed within the internal surfaces or strata of a circuit board. Moreover, the present invention is equally applicable to blind hole vias, i.e, vias that do not open on both sides of a circuit board. Thus, the present invention can be used to connect a surface of a circuit board with one of the internal strata of the board.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A double-sided printed wiring board comprising:

an insulator substrate having a via having sidewalls extending therethrough;

a first electrically conductive layer electrolytically disposed over both surfaces of said insulator substrate and through said via along said sidewalls between the opposite sides of said insulator substrate, and said first electrically conductive layer leaving a via-through-hole within said via and which via-through-hole extends between opposite sides of said insulator substrate;

a mass of conductive material filling said via-through-hole and having opposite ends located at each of the opposite sides of said insulator substrate, respectively; and a second electrically conductive layer covering said first electrically conductive layer disposed over both surfaces of said insulator substrate and covering both ends of said mass of conductive material on both sides of said insulator substrate.

2. The board according to claim 1, wherein said conductive material comprises a conductive ink having at least one of silver, copper, and a noble metal.

3. The board according to claim 1, wherein said first conductive layer comprises copper, and said second conductive layer comprises copper.

4. The board according to claim 3, wherein said first conductive layer has a thickness exceeding approximately 0.2 and said second conductive layer has a thickness between about 0.4 mils and about 0.8 mils.

5. A printed circuit board (PCB) having one or more strata and comprising:

a via extending through at least one of said strata, said via having sidewalls extending therethrough;

a first conductive material disposed on at least one side of said one of said strata and on said sidewalls of said via such that said via has an opening, said first conductive material comprising electrolytically deposited copper having a substantially uniform thickness exceeding approximately 0.2 mils;

a second conductive material disposed in said opening to substantially fill said opening; and p1 a third conductive material disposed on said first conductive material on said at least one side of said one of said strata and on an end of said second conductive material in said opening.

6. The board according to claim 5, wherein said second conductive material is a conductive ink.

7. A circuit board comprising:

a substrate having at least first and second generally parallel surfaces and a via extending through the substrate from the first surface to the second surface, the via having a sidewall;

a first conductive layer extending over substantially all of the first surface and the via sidewall;

a conductive material positioned within the via and surrounded by the first conductive layer extending over the via sidewall, the conductive material plugging the via such that the via has no opening extending from the first surface to the second surface; and a second conductive layer extending over substantially all of the first conductive layer on the first surface, and over an end portion of the conductive material positioned within the via.

8. The circuit board of claim 7 wherein the first and second surfaces are exterior surfaces of the substrate.

9. The circuit board of claim 7 wherein the first conductive layer comprises copper.

10. The circuit board of claim 9 wherein the second conductive layer comprises copper.

11. The circuit board of claim 7 wherein the conductive material positioned within the via is selected from the group consisting of conductive inks, conductive pastes, and conductive adhesives.

12. The circuit board of claim 11 wherein the conductive material is a conductive ink.

13. The circuit board of claim 12 wherein the conductive ink comprises at least one of silver, copper, and a noble metal.

14. The circuit board of claim 7 wherein the first and second conductive layers are adapted to be etched to thereby form wiring patterns on either one or both of the first and second surfaces.

15. A circuit board comprising:
   a substrate having at least first and second generally parallel surfaces and a via extending through the substrate from the first surface to the second surface, the via having a sidewall;
   a first conductive layer extending over substantially all of the first surface, the second surface, and the via sidewall;
   a conductive material positioned within the via and surrounded by the first conductive layer extending over the via sidewall, the conductive material substantially plugging the via such that the via has no opening extending from the first surface to the second surface;
   a second conductive layer extending over substantially all of the first conductive layer on the first surface, and over a first end portion of the conductive material positioned within the via; and
   a third conductive layer extending over substantially all of the first conductive layer on the second surface, and over a second end portion of the conductive material positioned within the via.

16. The circuit board of claim 15 wherein the first and second surfaces are exterior surfaces of the substrate.

17. The circuit board of claim 15 wherein the second and third conductive layers each comprise copper.

18. The circuit board of claim 15 wherein the first, second and third conductive layers are adapted to be etched to thereby form wiring patterns on either one or both of the first and second surfaces.

* * * * *

UNITED STATES PATENT AND TRADEMARK OFFICE
CERTIFICATE OF CORRECTION

PATENT NO. : 6,303,881 B1
DATED : October 16, 2001
INVENTOR(S) : John LeRoy Parker, jr. and Pamela L. Miscikowski It is certified that error appears in the above-identified patent and that said Letters Patent is hereby corrected as shown below:

Column 8,
Line 47, delete the word "p1".

Signed and Sealed this

Sixth Day of July, 2004

JON W. DUDAS
*Acting Director of the United States Patent and Trademark Office*